United States Patent
Yin et al.

(10) Patent No.: US 9,710,185 B2
(45) Date of Patent: Jul. 18, 2017

(54) COMPUTING SYSTEM WITH PARTIAL DATA COMPUTING AND METHOD OF OPERATION THEREOF

(71) Applicant: Samsung Electronics Co., Ltd., Suwon-si, Gyeonggi-Do (KR)

(72) Inventors: Liang Yin, San Jose, CA (US); Chaohong Hu, San Jose, CA (US)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 87 days.

(21) Appl. No.: 14/569,017

(22) Filed: Dec. 12, 2014

(65) Prior Publication Data
US 2016/0011817 A1    Jan. 14, 2016

Related U.S. Application Data

(60) Provisional application No. 62/023,149, filed on Jul. 10, 2014.

(51) Int. Cl.
| | |
|---|---|
| *G06F 12/00* | (2006.01) |
| *G06F 13/00* | (2006.01) |
| *G06F 13/28* | (2006.01) |
| *G06F 3/06* | (2006.01) |

(52) U.S. Cl.
CPC ............ *G06F 3/0644* (2013.01); *G06F 3/061* (2013.01); *G06F 3/0608* (2013.01); *G06F 3/0673* (2013.01); *G06F 3/0635* (2013.01); *G06F 3/0679* (2013.01)

(58) Field of Classification Search
CPC ...... G06F 3/0644; G06F 3/064; G06F 3/0608; G06F 3/0673; G06F 3/061; G06F 3/0613; G06F 12/0246; G06F 9/5016; G06F 13/16; G06F 3/0635; G06F 3/0679
USPC ................................ 711/154, 103, 118, 170
See application file for complete search history.

(56) References Cited

U.S. PATENT DOCUMENTS

| | | | |
|---|---|---|---|
| 6,799,293 B2 | 9/2004 | Peters et al. | |
| 8,122,204 B2 | 2/2012 | Nagao et al. | |
| 8,234,463 B2 | 7/2012 | Ikeuchi et al. | |
| 8,688,913 B2 | 4/2014 | Benhase et al. | |
| 8,688,914 B2 | 4/2014 | Benhase et al. | |
| 2004/0123039 A1* | 6/2004 | Berks .................. | G06F 12/0804 711/133 |
| 2005/0108573 A1* | 5/2005 | Bennett ............... | H04L 63/0245 726/4 |
| 2007/0033322 A1* | 2/2007 | Zimmer ............... | G06F 9/4401 711/103 |
| 2012/0102275 A1* | 4/2012 | Resnick ............... | G11C 7/1006 711/154 |
| 2015/0089316 A1* | 3/2015 | Zhang ............... | H03M 13/2942 714/755 |

\* cited by examiner

*Primary Examiner* — Mark Giardino, Jr.
*Assistant Examiner* — Shane Woolwine
(74) *Attorney, Agent, or Firm* — IP Investment Law Group

(57) ABSTRACT

A computing system includes: a memory computing block configured to: identify a partial data computing (PDC) command, a data mask, a partial data, or a combination thereof based on decoding a data packet, compute a computation result for identifying a portion of a read data to be modified according to the PDC command, the data mask, the partial data, or a combination thereof, generate a merge result based on modifying the portion of the read data according to the computation result, and a memory interface, coupled to the memory computing block, configured to transmit the merge result.

20 Claims, 6 Drawing Sheets ively as an example, by allowing the memory block to

COMPUTING SYSTEM WITH PARTIAL DATA COMPUTING AND METHOD OF OPERATION THEREOF

CROSS-REFERENCE TO RELATED APPLICATION(S)

This application claims the benefit of U.S. Provisional Patent Application Ser. No. 62/023,149 filed Jul. 10, 2014, and the subject matter thereof is incorporated herein by reference thereto.

TECHNICAL FIELD

An embodiment of the present invention relates generally to a computing system, and more particularly to a system with partial data computing.

BACKGROUND

Modern consumer and industrial electronics, such as computing systems, servers, appliances, televisions, cellular phones, automobiles, satellites, and combination devices, are providing increasing levels of functionality to support modern life. While the performance requirements can differ between consumer products and enterprise or commercial products, there is a common need for efficient data computation.

Research and development in the existing technologies can take a myriad of different directions. Some have taken a memory hierarchy approach for operational performance. Others operate on partial computing within the processors to only process a full line of read and write.

Thus, a need still remains for a computing system with partial data computing mechanism for efficiently computing data partially. In view of the ever-increasing commercial competitive pressures, along with growing consumer expectations and the diminishing opportunities for meaningful product differentiation in the marketplace, it is increasingly critical that answers be found to these problems. Additionally, the need to reduce costs, improve efficiencies and performance, and meet competitive pressures adds an even greater urgency to the critical necessity for finding answers to these problems. Solutions to these problems have been long sought but prior developments have not taught or suggested more efficient solutions and, thus, solutions to these problems have long eluded those skilled in the art.

SUMMARY

An embodiment of the present invention provides a computing system, including: a memory computing block configured to: identify a partial data computing (PDC) command, a data mask, a partial data, or a combination thereof based on decoding a data packet, compute a computation result for identifying a portion of a read data to be modified according to the PDC command, the data mask, the partial data, or a combination thereof, generate a merge result based on modifying the portion of the read data according to the computation result, and a memory interface, coupled to the memory computing block, configured to transmit the merge result.

An embodiment of the present invention provides a computing system, including: a host processor configured to generate a data packet for computing a computation result within a memory block to identify a portion of a read data to be modified according to a partial data computing (PDC) command, a data mask, a partial data, or a combination thereof; and a host interface, coupled to the host processor, configured to transmit the data packet including the PDC command, the data mask, the partial data, or a combination thereof.

An embodiment of the present invention provides a method of operation of a computing system, including: identifying a partial data computing (PDC) command, a data mask, a partial data, or a combination thereof based on decoding a data packet; computing a computation result with a memory computing block for identifying a portion of a read data to be modified according to the PDC command, the data mask, the partial data, or a combination thereof; generating a merge result based on modifying the portion of the read data according to the computation result; and transmitting the merge result.

An embodiment of the present invention provides a method of operation of a computing system, including: generating a data packet with a host processor for computing a computation result within a memory block to identify a portion of a read data to be modified according to a partial data computing (PDC) command, a data mask, a partial data, or a combination thereof; and transmitting the data packet including the PDC command, the data mask, the partial data, or a combination thereof.

Certain embodiments of the invention have other steps or elements in addition to or in place of those mentioned above. The steps or elements will become apparent to those skilled in the art from a reading of the following detailed description when taken with reference to the accompanying drawings.

DETAILED DESCRIPTION

Figure 1:
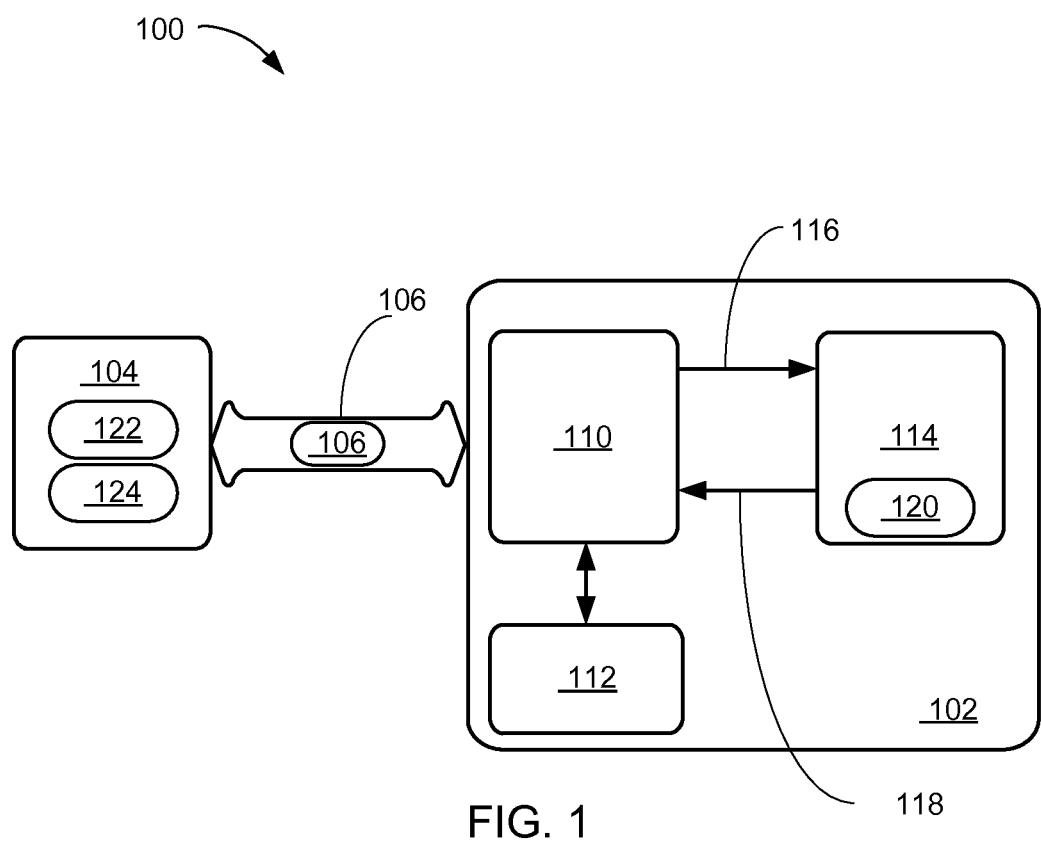
FIG. 1 is a computing system with a partial data computing mechanism in an embodiment of the present invention.

Various example embodiments include a memory computing block embedded inside of a memory block to improve computing efficiency. By embedding a memory computing block inside a memory block, the embodiments can perform the partial data computing atomically at the level of the memory block. More specifically as an example, by having the memory computing block inside of the memory block, the embodiments can operate on data of width narrower than the full-line of the read data. As a result, the memory block can include a new function to improve the efficiency for data computing.

Various example embodiments include partial data computing (PDC) commands for partial data computing, improving the performance of the computing system. More specifically as an example, by allowing the memory block to perform the partial data computation, the computing system can allocate more resource for the host device to perform additional computations to improve the overall system performance.

Various example embodiments include the PDC commands for partial data computing which improves the efficiency by improving the power consumption of the computing system. More specifically as an example, by allowing the memory block to perform the partial data computation within, the computing system can minimize the amount of external input/output required for a computing operation, thus, saving memory operation to improve bandwidth. Further, power consumption is lowered as transferring data to central processing unit is no longer needed. As a result, the computing system can improve efficiency by improving the bandwidth and power consumption by employing the partial data computing disclosed herein.

The following embodiments are described in sufficient detail to enable those skilled in the art to make and use the invention. It is to be understood that other embodiments would be evident based on the present disclosure, and that system, process, architectural, or mechanical changes can be made without departing from the scope of an embodiment of the present invention.

In the following description, numerous specific details are given to provide a thorough understanding of the various embodiments of the invention. However, it will be apparent that various embodiments may be practiced without these specific details. In order to avoid obscuring various embodiments, some well-known circuits, system configurations, and process steps are not disclosed in detail.

The drawings showing embodiments of the system are semi-diagrammatic, and not to scale and, particularly, some of the dimensions are for the clarity of presentation and are shown exaggerated in the drawing figures. Similarly, although the views in the drawings for ease of description generally show similar orientations, this depiction in the figures is arbitrary for the most part. Generally, an embodiment can be operated in any orientation.

The term "module" referred to herein can include software, hardware, or a combination thereof in an embodiment of the present invention in accordance with the context in which the term is used. For example, a software module can be machine code, firmware, embedded code, and/or application software. Also for example, a hardware module can be circuitry, processor(s), computer(s), integrated circuit(s), integrated circuit cores, pressure sensor(s), inertial sensor(s), microelectromechanical system(s) (MEMS), passive devices, or a combination thereof. Further, if a module is written in the apparatus claims section, the modules are deemed to include hardware circuitry for the purposes and the scope of apparatus claims.

The modules in the following description of the embodiments can be coupled to one other as described or as shown. The coupling can be direct or indirect without or with, respectively, intervening items between coupled items. The coupling can be physical contact or by communication between items.

Referring now to FIG. 1, therein is shown a computing system 100 with a partial data computing mechanism in an embodiment of the present invention. FIG. 1 depicts one embodiment of the computing system 100 where partial data is computed atomically. The term partial data being computed atomically refers to data computation for at least one of the operands of an operation. The operation can be a function found in an arithmetic logic unit (ALU) found in a processor. Examples of such operations can include an arithmetic operation, a Boolean operation, a shift operation, finite field math operation, or a combination thereof. The term atomic operation refers to an operation not being able to be interrupted in the middle by another operation. More specifically as an example, the subsequent operation can be initiated after the previous operation is completed.

The computing system 100 can include a host device 104, a communication bus 106, and a memory block 102. The host device 104 interacts with the memory block 102. For example, the host device 104 can provide a data packet 108 for storing in the memory block 102. The host device 104 can offload some computation to the memory block 102. For example, the host device 104 can also issue a command to the memory block 102 for the memory block 102 to perform the partial data computing or data computing with data from the memory block 102.

The host device 104 can include a host processor 122. The host processor 122 provides a compute engine for the host device 104. For example, the host processor 122 can generate the data packet 108. For further example, the host processor 122 can generate the data packet 108, including the command for the memory block 102 to perform the partial data computing or data computing with data from the memory block 102.

The host device 104 can include a host interface 124. The host interface 124 communicates with the memory block 102. For example, the host interface 122 transmits the data packet 108 to the memory block 102 via the communication bus 106. The host interface 124 can also receive a return value generated by the memory block 102 for the host device 104.

The communication bus 106 provides communication between the host device 104 and the memory block 102. For example, the communication bus 106 can represent an address bus, a data bus, a control bus, or a combination thereof. For further example, the communication bus 106 can represent a random access memory (RAM) bus, a peripheral component interconnect (PCI) bus, an accelerated graphics port (AGP) bus, or a combination thereof. For another example, the communication bus 106 can include an Industry Standard Architecture (ISA) bus, a Micro Channel Architecture (MCA) bus, an Extended Industry Standard Architecture (ESA) bus, or a combination thereof.

The memory block 102 provides access to data stored in the memory block 102. The memory block 102 also provides a computational resource to the computing system 100 as well. The memory block 102 can be implemented with hardware, such as logic gates or circuitry (analog or digital). Also for example, the memory block 102 can be implemented with a hardware finite state machine, combinatorial logic, or a combination thereof.

The memory block 102 can include a random access memory (RAM) device or core. As a core, the memory block 102 can be integrated into a larger device (such as an integrated circuit device, a processor, an application specific standard product, an application specific integrated circuit, a system on a chip, or a combination thereof). The memory block 102 can include volatile memory, such as a dynamic random access memory (DRAM) or a static random access memory (SRAM). The memory block 102 can also comprise nonvolatile memory, such as a solid state flash memory.

The memory block 102 can include a memory interface 110, a memory computing block 112, and a storage block 114. The memory interface 110 provides input/output functionality for the memory block 102. The memory computing block 112 provides a compute engine for the memory block 102. The memory computing block 112 can be a processor, an embedded processor, a microprocessor, a hardware control logic, a hardware finite state machine (FSM), a digital signal processor (DSP), or a combination thereof. The storage block 114 provides for saving information or data for the memory block 102.

The memory interface 110 can receive the data packet 108 as an input through the communication bus 106 from the host device 104. The memory interface 110 can send the data packet 108 as an output through the communication bus 106 to the host device 104.

The memory interface 110 can communicate the data packet 108 to or from the memory computing block 112. The memory interface 110 can perform a read from the storage block 114 or a write to the storage block 114. More specifically as an example, the memory interface 110 can write the data packet 108 by sending an operation data 116 to the storage block 114. The memory interface 110 can perform the read by receiving a read data 118 from the storage block 114. The memory interface 110 can read out stored data 120 from the storage block 114 as the read data 118.

The memory interface 110 can be implemented in a number of ways. As an example, the memory interface 110 can provide physical layer (such as electrical levels or optical wavelengths or acoustic levels) support. The memory interface 110 can also provide protocol support (such as electrical, optical, or acoustic timing). The memory interface 110 can further provide processing of some of the information received, or format information being sent out as output, as will be described in detail in FIG. 2.

The memory computing block 112 can be embedded inside the memory block 102. As an example, the memory computing block 112 can receive the data packet 108 from the communication bus 106 through the memory interface 110. The memory computing block 112 can receive the read data 118 from the storage block 114. The memory computing block 112 can perform partial data computing operations based on the data packet 108 and the read data 118. Details regarding the memory computing block 112 performing a partial data computing operation will be discussed below.

It has been discovered that the computing system 100 including the memory computing block 112 embedded inside of the memory block 102 can improve system efficiency. By embedding the memory computing block 112, the memory computing block 112 can perform the partial data computing atomically or data computation at the memory block 102 and not at the host device 104. More specifically as an example, the memory computing block 112 can perform the partial data computing atomically without interruption by another operation. By having the memory computing block 112 inside of the memory block 102, the computing system 100 can operate on data of width narrower than the full-line of the read data 118. As a result, the memory block 102 can include a new function to improve the efficiency for data computing.

Figure 2:
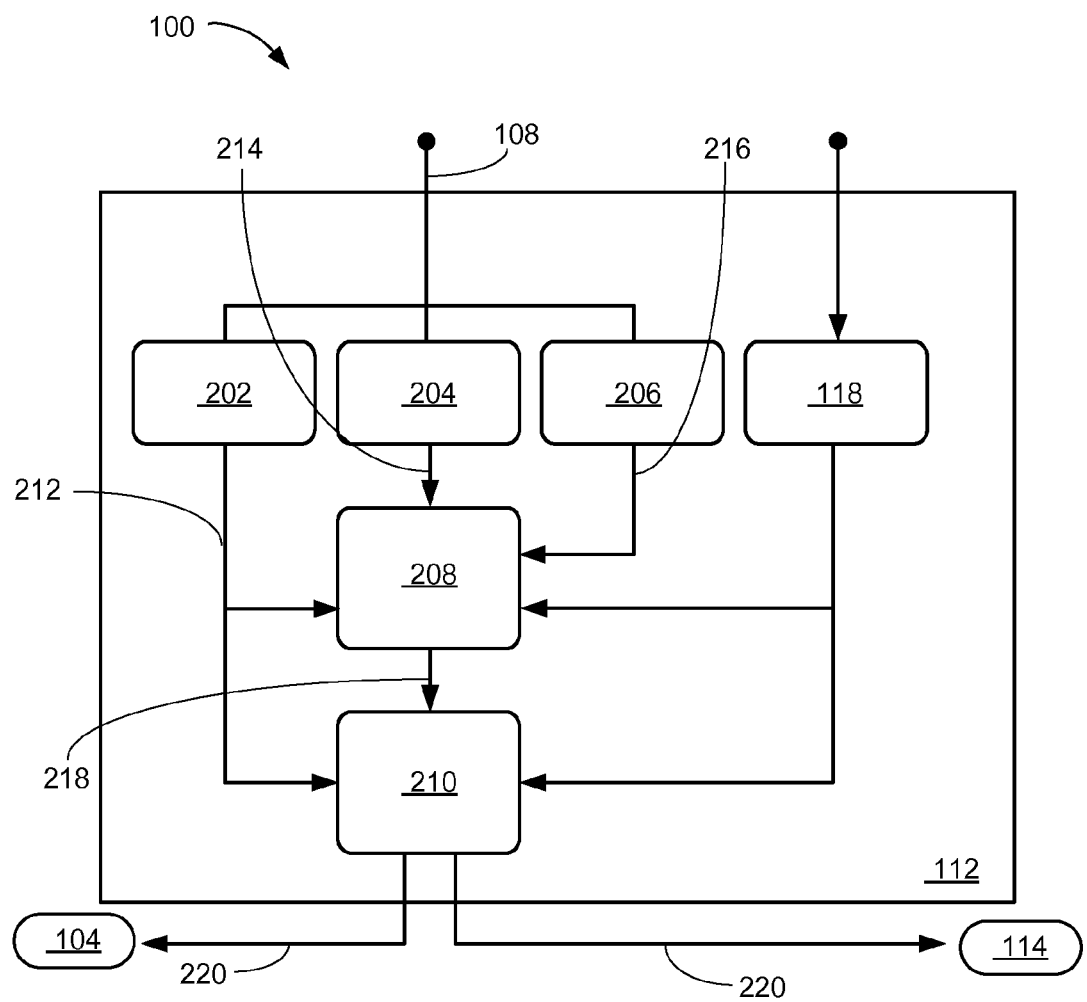
FIG. 2 is a block diagram of the memory computing block as an embodiment of the present invention.

Referring now to FIG. 2, therein is shown a block diagram of the memory computing block 112 as an embodiment of the present invention. The memory computing block 112 can include a mask decoding block 202, a command decoding block 204, a data decoding block 206, a memory computing sub-block 208, and a merging block 210, in an embodiment of the present invention. For a different example embodiment, the memory computing sub-block 208 and the merging block 210 can be combined into one functional block.

The mask decoding block 202 decodes the data packet 108 from the host device 104 of FIG. 1. The mask decoding block 202 can be processing circuitry, a hardware control logic, a hardware finite state machine (FSM), combinatorial logic, or a combination thereof. For example, the mask decoding block 202 can decode the data packet 108 to identify a data mask 212. The data mask 212 indicates a portion of the read data 118 that needs to be potentially modified. The mask decoding block 202 can provide the data mask 212 to the memory computing sub-block 208, the merging block 210, or a combination thereof.

The command decoding block 204 decodes the data packet 108 from the host device 104. The command decoding block 204 can be processing circuitry, a hardware control logic, a hardware finite state machine (FSM), combinatorial logic, or a combination thereof. For example, the command decoding block 204 can decode the data packet 108 to identify a partial data computing (PDC) command 214. The PDC command 214 provides an operation code (opcode) for execution by the memory computing block 112. For example, the PDC command 214 can represent opcodes from an ALU instruction set. For a specific example, the PDC command 214 can include add, subtract, multiply, divide, shift left, shift right, or finite field operations, or a combination thereof. The PDC command 214 can include the address for the storage block 114 of FIG. 1 for the stored data 120. Details will be discussed below. The command decoding block 204 can transmit the PDC command 214 to the memory computing sub-block 208.

The data decoding block 206 decodes the data packet 108 from the host device 104. The data decoding block 206 can be processing circuitry, a hardware control logic, a hardware finite state machine (FSM), combinatorial logic, or a combination thereof. For example, the data decoding block 206 can decode the data packet 108 for identifying a partial data 216. The partial data 216 is information used to potentially update at least a portion the read data 118. For further example, the computation for the partial data 216 can be based on the read data 118. The data decoding block 206 can transmit the partial data 216 to the memory computing sub-block 208.

The memory computing sub-block 208 computes a computation result 218. The memory computing sub-block 208 can be processing circuitry, a hardware control logic, a hardware finite state machine (FSM), combinatorial logic, or a combination thereof. The memory computing sub-block 208 can compute the computation result 218 based on the data mask 212, the PDC command 214, the partial data 216, or a combination thereof to update a specific portion of the read data 118. More specifically as an example, the computation result 218 can indicate the computing system 100 to modify a specific portion of the read data 118, permitted by the data mask 212, with the partial data 216.

For further example, the memory computing sub-block 208 can operate on a portion of the read data 118 based on the data mask 212. Furthermore, the memory computing sub-block 208 can include the PDC command 214 in the computation result 218 for a type of update to be performed on the read data 118 with the partial data 216, the read data 118, or a combination thereof.

More specifically as an example, the memory computing sub-block 208 can operate on a portion of the read data 118 based on updating with the partial data 216 from the host device 104. For a different example, the memory computing sub-block 208 can operate on a portion of the read data 118 based on the read data 118. More specifically as an example, the memory computing sub-block 208 can receive two different instances of the read data 118. Based on the PDC command 214, the memory computing sub-block 208 can operate on a portion of the read data 118 with another different instance of the read data 118.

For a further example, the read data 118 can represent a 512-bit line. Rather than updating a full-line of the read data 118, the memory computing sub-block 208 can compute for the portion of the full-line of the read data 118 to be updated. The full-line can represent 512-bits. More specifically as an example, the memory computing sub-block 208 can compute the computation result 218 indicating the portion of the read data 118 with the data mask 212 to update the read data 118 with the partial data 218. Details will be discussed below. The memory computing sub-block 208 can provide the computation result 218 to the merging block 210.

The merging block 210 generates a merge result 220 to be written in the storage block 114. The merging block 210 can be processing circuitry, a hardware control logic, a hardware finite state machine (FSM), combinatorial logic, or a combination thereof. For example, the merging block 210 can generate the merge result 220 based on merging the computation result 218 with the read data 118. More specifically as an example, the merging block 210 can generate the merge result 220 by updating a portion of the read data 118 based on the data mask 212, the partial data 216, the read data 118, or a combination thereof according to the PDC command 214. Details regarding the update will be discussed below.

The merging block 210 can transmit the merge result 220 to the host device 104, the storage block 114, or a combination thereof. More specifically as an example, the merging block 210 can transmit the merge result 220 based on the PDC command 214 to the host device 104, the storage block 114, or a combination thereof.

It has been discovered that the computing system 100 executing the PDC command 214 in the memory block 102 for data computing improves the efficiency of updating the read data 118. By executing the PDC command 214, the computing system 100 can update a specific portion of the read data 118 rather than a full-line of the read data 118. As a result, a more efficient design of computation systems can be achieved.

It has further been discovered that the computing system 100 including the PDC command 214 for partial data computing improves the performance of the computing system 100. More specifically as an example, by allowing the memory block 102 to perform the partial data computation, the computing system 100 can allocate or free up more resources for the host device 104 to perform additional computations, thereby enhancing performance.

It has yet further been discovered that the computing system 100, including the PDC command 214 for partial data computing, improves efficiency by improving the power consumption of the computing system 100. More specifically as an example, by allowing the memory block 102 to perform the partial data computation within the memory block 102, the computing system 100 can minimize the amount of external input/out required for a computing operation, thus, lowering the power consumption. As a result, the computing system 100 can improve power consumption by employing the partial data computing.

Figure 3:
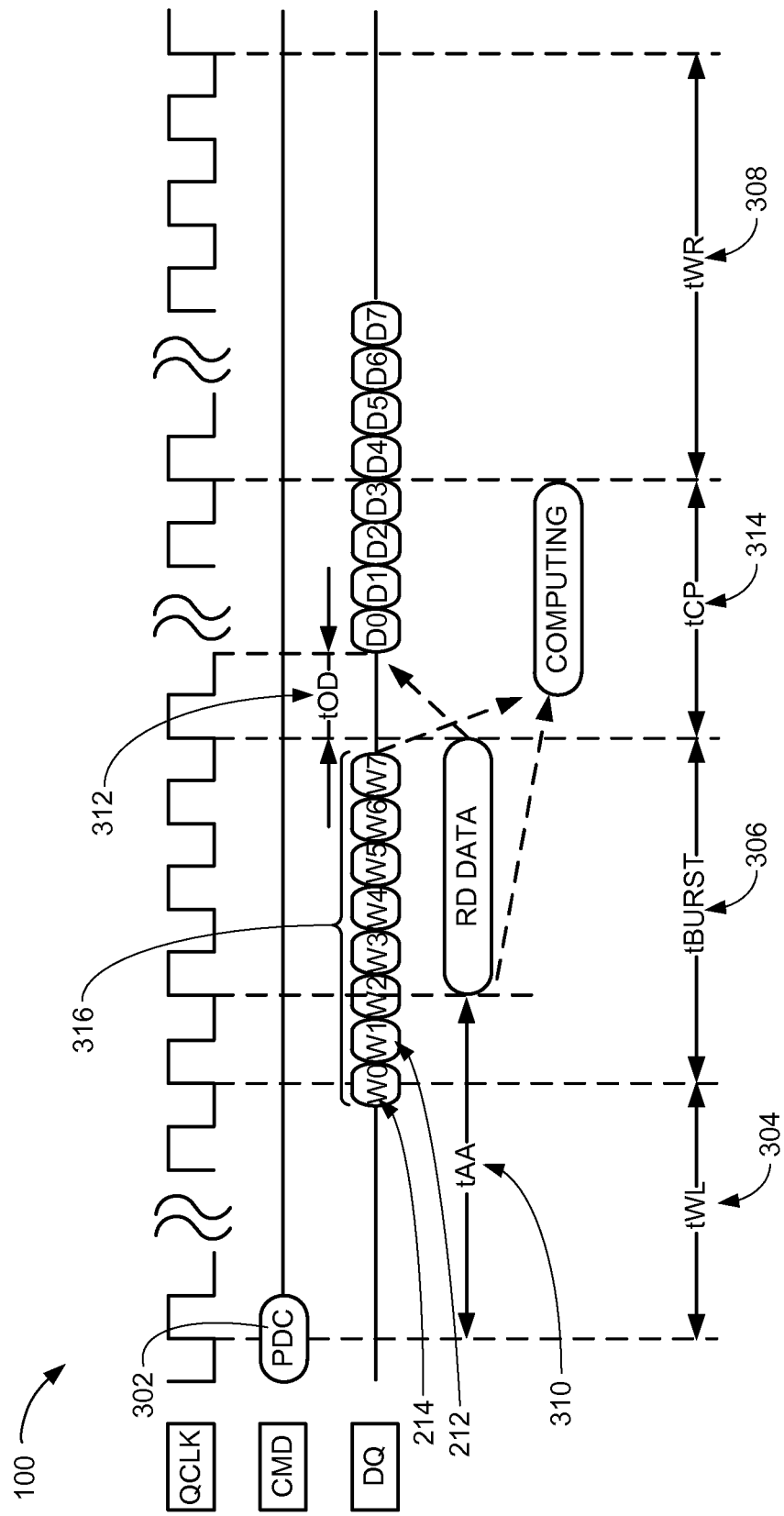
FIG. 3 is a timing diagram of partial data computing for the PDC command representing the write command in a further embodiment of the present invention.

Referring now to FIG. 3, therein is shown a timing diagram of partial data computing for a PDC command 214 in a further embodiment of the present invention. As an example of the embodiment, the following factors can be considered:

The delay between a command field 302 and arrival of an operation data 116, such as for example, the write data: tWL (referred to as an operational data delay 304)

The burst length: tBURST (referred to as a burst duration 306)

The duration to complete operation, such as a write operation: tWR (referred to as an operation completion duration 308)

The delay between the command field 302 and the read data 118 being ready: tAA (referred to as a read data delay 310)

The delay between the end of an operational burst, such as a write burst, and the start of a return burst: tOD (referred to as an operational return delay 312)

The time for computing: tCP (referred to as a computing duration 314)

The command field 302 provides a type of instruction to be performed by the memory block 102 of FIG. 1. For example, the command field 302 can provide the opcode for the PDC command 214. The command field 302 can provide an opcode involving a read operation for the read data 118 from the storage block 114. The operational data delay 304 can indicate the timing between the PDC command 214 and the read data 118 being ready.

For illustrative purposes, the factors noted earlier are depicted to be measured or triggered off a rising edge of the clock labeled as "QCLK" in FIG. 3. Although it is understood that the factors can be measured or triggered differently. For example, the factors can be based off the falling edge of QCLK. As a further example, the factors can be measured or triggered off both the rising edge and the falling edge of QCLK.

As indicated above, the data packet 108 of FIG. 1 from the host device 104 of FIG. 1 can include the PDC command 214, the data mask 212, or a combination thereof, which are encoded as a first two instances of data chunks 316, respectively, and represented as W0 and W1 in FIG. 3. The data chunks 316 are decoded data from the data packet 108. The data chunks 316 for the data packet 108 can represent the partial data 216 illustrated as W2, W3, W4, W5, W6, and W7.

For another example, the data chunks 316 can be arranged differently. More specifically as an example, the data packet 108 can include a plurality of the PDC command 214, the data mask 212, or a combination thereof without the partial data 216. As an example, the modification of the read data 118 of FIG. 1 can be based on another different instance of the read data 118.

In this example, the data packet 108 can include one instance of the data chunks 316 representing W0 to include the PDC command 214 with the address for the storage block 114 of FIG. 1 for one instance of the stored data 120 of FIG. 1. And the data packet 108 can also include the data chunks 316 representing W2, W3, W4, W5, W6, or W7 to include the PDC command 214 with the address for the storage block 114 for another difference instance of the stored data 120. For a different example, the data packet 108 can include the PDC command 214 in one instance of the data chunks 316 and the address for the storage block 114 in a different instance of the data chunks 316.

The computation for the computation result 218 of FIG. 3 can be triggered after the operational data delay 304 and the burst duration 306. Additionally, the computation for the computation result 218 can be triggered after the read data delay 310. The computation result 218 can be computed within the computing duration 314. Furthermore, the merge result 220 of FIG. 3 can be returned to the host device 104, the storage block 114 of FIG. 2, or a combination thereof can be prepared after the operational return delay 312.

Figure 4:
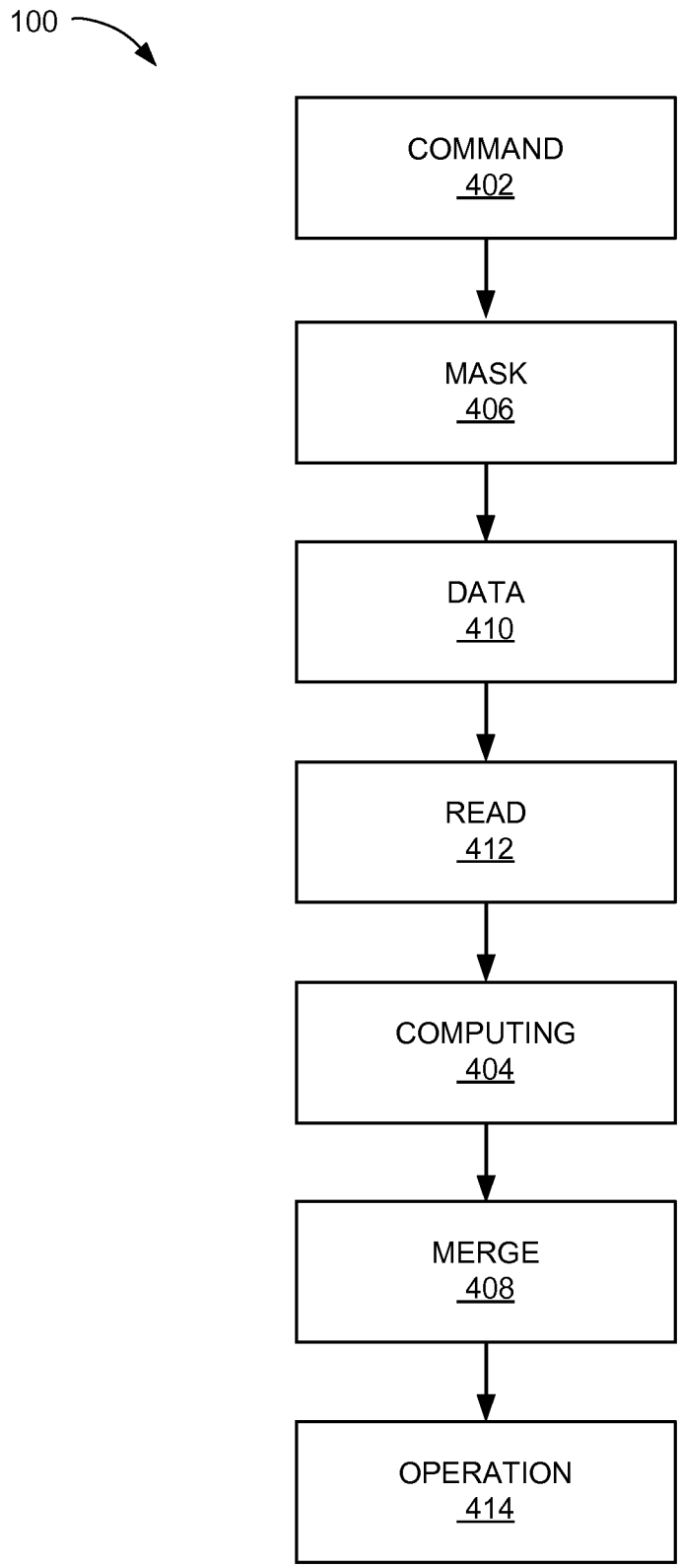
FIG. 4 is a control flow the computing system.

Referring now to FIG. 4, therein is shown a control flow of the computing system 100. The computing system 100 can include a command module 402. The command module 402 identifies the PDC command 214 of FIG. 2. For example, the command module 402 can determine the PDC command 214 based on identifying the command field 302 of FIG. 3 by decoding the data packet 108 of FIG. 1 from the host device 104 of FIG. 1.

More specifically as an example, the command module 402 can utilize the command decoding block 204 of FIG. 2. The data packet 108 can include the data chunks 316 of FIG. 3. The command module 402 can determine the PDC command 214 based on decoding the data chunks 316 to identify a type of opcode to be executed with the memory computing block 112 in the memory block 102. The operation can include potential modifications with the read data 118 of FIG. 1 from the memory block 102.

The command module 402 can adhere to the operational data delay 304 of FIG. 3. For example, the command module 402 can determine the PDC command 214 after the command field 302 is decoded. For a specific example, the command module 402 can decode the data packet 108 for the data chunks 316 for the PDC command 214 after the operational data delay 304. The command module 402 can transmit the PDC command 214 to a mask module 406.

The computing system 100 can include the mask module 406, which can be coupled to the command module 402. The mask module 406 determines the data mask 212 of FIG. 2. For example, the mask module 406 can determine the data mask 212 based on decoding the data packet 108 received from the host device 104.

More specifically as an example, the mask module 406 can utilize the mask decoding block 202 of FIG. 2. The mask module 406 can identify the data mask 212 from the data packet 108 based on decoding the data chunks 316, which is noted as W1 in FIG. 3. The data mask 212 identifies a portion of the read data 118 that potentially require modification.

The mask module 406 can adhere to the operational data delay 304. For example, the command module 402 can determine the data mask 212 after the data chunks 316 for the PDC command 214 is determined. For a specific example, the mask module 406 can decode the data packet 108 after the operational data delay 304, or during the burst duration 306 of FIG. 3. The mask module 406 can transmit the data mask 212 to a data module 410.

The computing system 100 can include the data module 410, which can be coupled to the mask module 406. The data module 410 identifies the partial data 216 of FIG. 2. For example, the data module 410 can identify the partial data 216 based on decoding the data packet 108 received from the host device 104.

More specifically as an example, the data module 410 can utilize the data decoding block 206 of FIG. 2. The data module 410 can identify the partial data 216 based on decoding the data chunks 316 following the data chunks 316 for the PDC command 214 and the data mask 212, in this example. The data module 410 can decode the data packet 108 after the operational data delay 304. The data module 410 can transmit the partial data 216 to a computing module 404.

The computing system 100 can include a read module 412, which can be coupled to the data module 410. The read module 412 obtains the read data 118 of FIG. 1. For example, the read module 412 can obtain the read data 118 based on reading the stored data 120 of FIG. 1 from the storage block 114 of FIG. 1.

More specifically as an example, the read module 412 can utilize the memory interface 110 of FIG. 1. The read module 412 can obtain the read data 118 in a full line (512-bit).

Furthermore, the read module 412 can adhere to the read data delay 310 of FIG. 3. For a specific example, the read module 412 can obtain the read data 118 after the data mask 212, the PDC command 214, or a combination thereof is decoded. For further example, the read module 412 can obtain the read data 118 during the burst duration 306. The read module 412 can transmit the read data 118 to the computing module 404.

The computing system 100 can include the computing module 404, which can be coupled to the read module 412 (and data module 410, as described above). The computing module 404 computes the computation result 218 of FIG. 2.

The computing module 404 can compute the computation result 218 in a number of ways. The computing module 404 can compute the computation result 218 based on the data mask 212, the PDC command 214, the partial data 216, the read data 118, or a combination thereof. More specifically as an example, the computing module 404 can operate on a specific portion of the read data 118 based on the data mask 212, the PDC command 214, or a combination thereof.

For a specific example, the computing module 404 can operate on a portion of the read data 118 for potential modification based on the data mask 212. Furthermore, the computing module 404 can use the PDC command 214 in computing the result 218 for a type of update to be performed on the read data 118 with the partial data 216. More specifically as an example, the computing module 404 can operate on the portion of the read data 118 based on the partial data 216 from the host device 104.

For another example, the computing module 404 can operate on the portion of the read data 118 based on another different instance of the read data 118 from the storage block 114 similarly to how the read data 118 is updated based on the partial data 216. More specifically as an example, the computing module 404 can compute the computation result 218 based on different instance of the read data 118. For example, one different instance of the read data 118 can represent as the input in an operation to update another instance of the read data 118. The computing module 404 can compute for the computation result 218 using the PDC command 214 to update a specific portion of one instance of the read data 118 based on another instance of the read data 118.

It has been discovered that the computing system 100 computing the computation result 218 improves the efficiency for updating the read data 118. By computing the computation result 218, the computing system 100 can update a portion of the read data 118 rather than a full line of the read data 118. As a result, a more efficient design of the computing system 100 can be achieved.

The computing module 404 can adhere to the computing duration 314 of FIG. 3. More specifically as an example, the computing module 404 can compute for the computation result 218 after the operational data delay 304, the burst duration 306, the read data delay 310, or a combination thereof.

For another example, the computing module 404 can compute for the computation result 218 during the burst duration 306 based on an arrangement of the data chunks 316, the data mask 212, or a combination thereof. More specifically as an example, based on the data mask 212, and the location of the partial data 216 to be operated on, the data chunks 316 can differ. As a result, the computing module 404 can start the computation duration 314 earlier by computing for the computation result 218 during the burst duration 306. The computing module 404 can transmit the computation result 218 to a merge module 408.

The computing system 100 can include the merge module 408, which can couple to the computing module 404. The merge module 408 generates the merge result 220 of FIG. 2. For example, the merge module 408 can generate the merge result 220 based on the computation result 218, the read data 118, or a combination thereof.

The merge module 408 can generate a merge result 220 for updating the storage block 114. For example, the merge module 408 can generate the merge result 220 based on merging the computation result 218 with the read data 118. More specifically as an example, the merge module 408 can generate the merge result 220 by updating a portion of the read data 118, determined by the data mask 212, with the partial data 216, the read data 118, the computation result 218, or a combination thereof according to the PDC command 214.

The merge module 408 can adhere to the computing duration 314 of FIG. 3. More specifically as an example, the merge module 408 can generate the merge result 220 after the operational data delay 304, the burst duration 306, the read data delay 310, or a combination thereof. The merge module 408 can transmit the merge result 220 to an operation module 414.

The computing system 100 can include the operation module 414, which can couple to the merge module 408. The operation module 414 operates with the merge result 220. For example, the operation module 414 can write the merge result 220 as the operation data 116 of FIG. 1.

More specifically as an example, the operation module 414 can utilize the memory interface 110. The operation module 414 can operate with the operation data 116 based on the merge result 220, the PDC command 214, or a combination thereof to update the stored data 120 of the storage block 114. For another example, the operation module 414 can transmit the merge result 220 based on the PDC command 214 to the host device 104 as the result data. The operation module 414 can adhere to the operational return delay 312 of FIG. 3, the operation completion duration 308 of FIG. 3, or a combination thereof.

Figure 5:
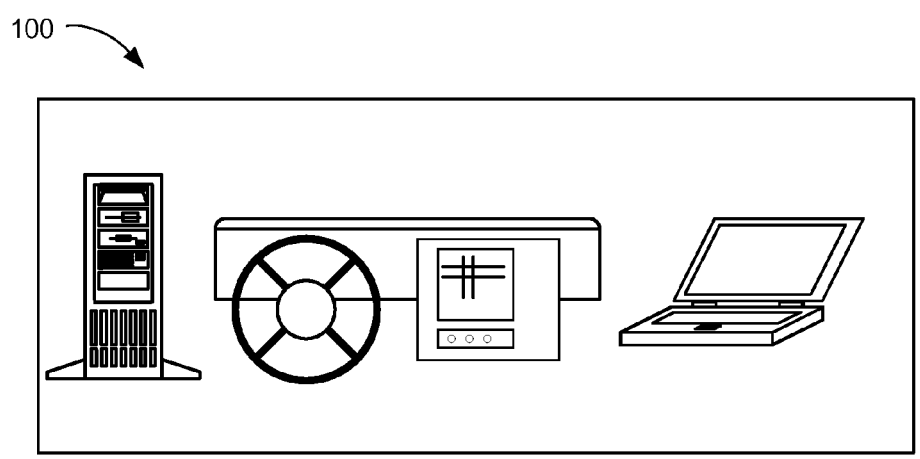
FIG. 5 is application examples of the computing system as with an embodiment of the present invention.

Referring now to FIG. 5, therein are application examples of the computing system 100 with an embodiment of the present invention. FIG. 5 depicts various embodiments, as examples, for the computing system 100, such as a computer server, a dash board of an automobile, a smartphone, a mobile device, and a notebook computer.

These application examples illustrate the importance of the various embodiments of the present invention to provide improved efficiency for updating the stored data 120 of FIG. 1. The partial data computing can update the stored data 120 in the memory block 102 of FIG. 1. This is accomplished with computing the computation result 218 of FIG. 2 based on the data mask 212 of FIG. 2, the PDC command 214 of FIG. 2, the read data 118 of FIG. 1, the partial data 216 of FIG. 2, or a combination thereof. The partial computing improves efficiency by avoiding the update of a full line of the read data 118 but rather focuses on the portion of the read data 118 to be updated.

The computing system 100, such as the computer server, the dash board, and the notebook computer, can include a one or more of a subsystem (not shown), such as a printed circuit board having various embodiments of the present invention or an electronic assembly having various embodiments of the present invention. The computing system 100 can also be implemented as an adapter card.

Figure 6:
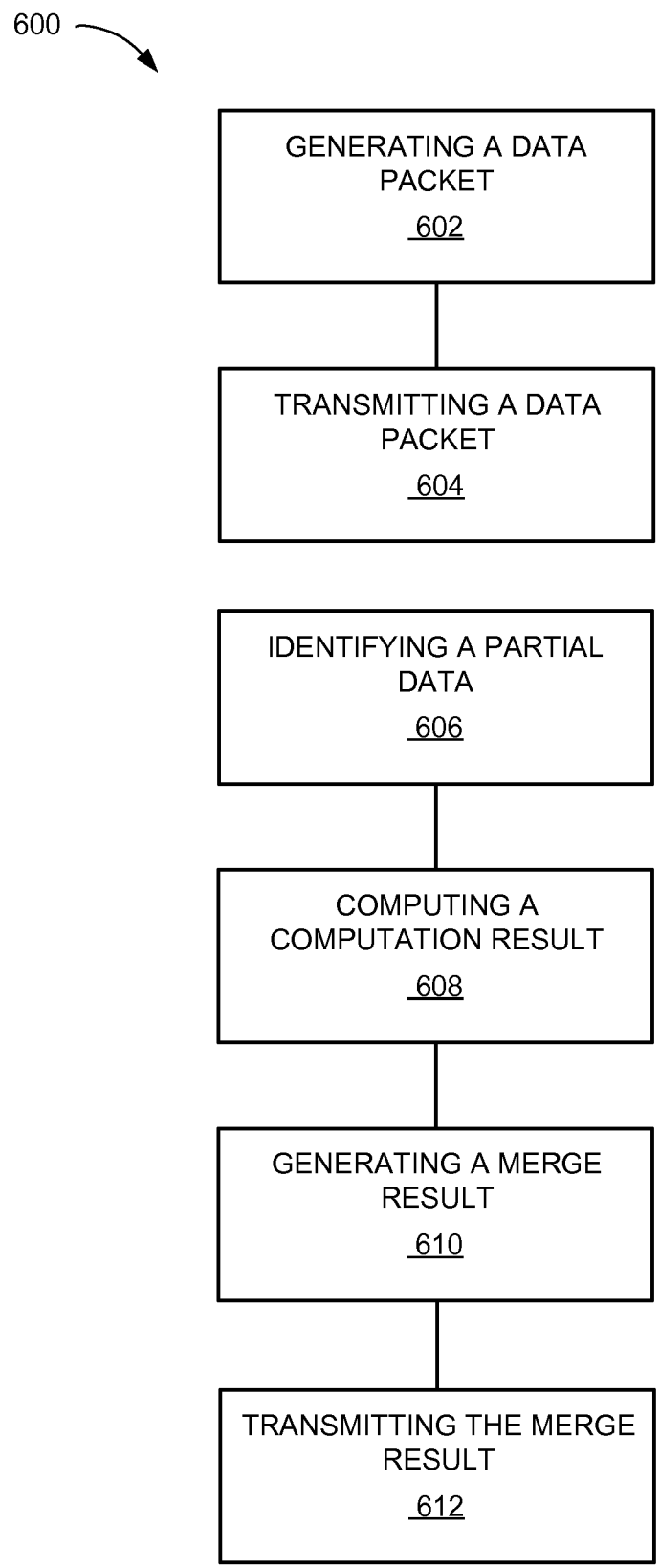
FIG. 6 is a flow chart of a method of operation of a computing system in an embodiment of the present invention.

Referring now to FIG. 6, therein is shown a flow chart of a method 600 of operation of a computing system 100 in an embodiment of the present invention. The method 600 includes: generating a data packet with a host processor for computing a computation result within a memory block to identify a portion of a read data to be modified according to a partial data computing (PDC) command, a data mask, a partial data, or a combination, in a block 602; transmitting the data packet including the PDC command, the data mask, the partial data, or a combination thereof in block 604; identifying a partial data computing (PDC) command, a data mask, a partial data, or a combination thereof based on decoding a data packet in block 606; computing a computation result with a memory computing block using a portion of a read data to be modified according to the PDC command, the data mask, the partial data, or a combination thereof in block 608; generating a merge result based on modifying the portion of the read data according to the computation result in a block 610; and transmitting the merge result in a block 612.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization. Another important aspect of an embodiment of the present invention is that it valuably supports and services the historical trend of reducing costs, simplifying systems, and increasing performance. These and other valuable aspects of an embodiment of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters set forth herein or shown in the accompanying drawings are to be interpreted in an illustrative and non-limiting sense.

What is claimed is:

1. A computing system comprising: a memory block, representing a volatile memory, including:
    a memory interface configured to receive a data packet from a host processor separate from the hardware memory computing block, and
    a hardware memory computing block, coupled to the memory interface, including:
    a hardware command decoding block configured to identify a partial data computing (PDC) command based on decoding the data packet,
    a hardware mask decoding block, coupled to the command decoding block, configured to identify a data mask based on decoding the data packet,
    a hardware data decoding block, coupled to the mask decoding block, configured to identify a partial data based on decoding the data packet,
    a hardware memory computing sub-block, coupled to the command decoding block, the mask decoding block, and the data decoding block, configured to compute a computation result for identifying a portion of a read data to be modified according to the PDC command, the data mask, and the partial data,
    a hardware merging block, coupled to the memory computing sub-block, configured to generate a merge result based on modifying the portion of the read data according to the computation result by the hardware memory computing block, wherein the read data is one or more full bit lines of data and the partial data operates on a portion of the read data, and
wherein the memory interface is, configured to transmit the merge result.

2. The system as claimed in claim 1 wherein the hardware memory computing block includes:
the hardware memory computing sub-block configured to:
receive a first instance of the read data;
receive a second different instance of the read data; and
the hardware merging block, coupled to the hardware memory computing sub-block, configured to generate the merge result based on modifying a portion of the first instance of the read data with the second different instance of the read data.

3. The system as claimed in claim 1 wherein the hardware memory computing block includes the hardware memory computing sub-block configured to compute the computation result based on the data mask for narrowing the portion of the read data to be modified with the partial data after an operation data delay, a burst duration, and a read data delay.

4. The system as claimed in claim 1 wherein the hardware memory computing block includes the hardware mask decoding block configured to decode the data packet for identifying a plurality of the PDC command in different instances of a data chunk of the data packet.

5. The system as claimed in claim 1 wherein the memory interface is configured to transmit an operation data for updating a host device, a storage block, or a combination thereof with the merge result.

6. The system as claimed in claim 1 wherein the memory interface is configured to receive a data packet for processing the data packet, including the PDC command, the data mask, the partial data, or a combination thereof, generated by a host processor.

7. The system as claimed in claim 1 further comprising a storage block, coupled to the memory interface, configured to update a stored data based on the merge result.

8. The system as claimed in claim 1 wherein the hardware memory computing block includes the hardware mask decoding block configured to identify the data mask based on decoding a data chunk for identifying the portion of the read data to be updated.

9. The system as claimed in claim 1 wherein the hardware memory computing block includes the hardware command decoding block configured to execute the PDC command for modifying the portion of the read data.

10. The system as claimed in claim 1 wherein the hardware memory computing block includes the hardware merge block configured to generate the merge result based on merging the computation result with the read data for updating the portion of the read data.

11. A method of operation of a computing system comprising:
receiving a data packet from a host processor separate from a hardware memory computing block included in a memory block including a volatile memory;
identifying a partial data computing (PDC) command by a hardware command decoding block, a data mask by a hardware mask decoding block, and a partial data by a hardware data decoding block based on decoding a data packet;
computing a computation result with a memory computing sub-block for identifying a portion of a read data to be modified according to the PDC command, the data mask, and the partial data wherein the hardware command decoding block, the hardware mask decoding block, and the hardware data decoding block are independent from one another but directly couple to the memory computing sub-block within the hardware memory computing block;
generating a merge result based on modifying the portion of the read data according to the computation result by the memory computing block, wherein the read data is one or more full bit lines of data and the partial data operates on a portion of the read data; and transmitting the merge result.

12. The method as claimed in claim 11 further comprising:
receiving a first instance of the read data;
receiving a second different instance of the read data; and
wherein generating the merge result includes:
generating the merge result based on modifying a portion of the first instance of the read data with the second different instance of the read data.

13. The method as claimed in claim 11 wherein computing the computation result includes computing the computation result based on the data mask for narrowing the portion of the read data to be modified with the partial data after an operation data delay, a burst duration, and a read data delay.

14. The method as claimed in claim 11 further comprising decoding the data packet for identifying PDC commands in different instances of a data chunk of the data packet.

15. The method as claimed in claim 11 further comprising transmitting an operation data for updating a host device, a storage block, or a combination thereof with the merge result.

16. A method of operation of a computing system comprising: generating a data packet with a host processor for computing a computation result by a hardware memory computing sub-block within a memory block including a volatile memory to identify a portion of a read data to be modified according to a partial data computing (PDC) command identified by a hardware command decoding block, wherein the read data is one or more full bit lines of data and the partial data operates on a portion of the read data, a data mask identified by a hardware mask decoding block, and a partial data identified by a hardware data decoding block wherein the hardware command decoding block, the hardware mask decoding block, and the hardware data decoding block are independent from one another but directly couple to the hardware memory computing sub-block within a hardware memory computing block included in the memory block separate from the host processor; and
transmitting the data packet including the PDC command, the data mask, and the partial data to the hardware memory computing block.

17. The method as claimed in claim 16 wherein generating the data packet includes generating the data packet including a plurality of the PDC command for modifying the portion of the read data with a different instance of the read data.

18. The method as claimed in claim 16 wherein generating the data packet includes generating the data packet including the data mask for narrowing the portion of the read data to be modified with the partial data.

19. The method as claimed in claim 16 wherein generating the data packet includes generating the data packet including the PDC command for modifying the portion of the read data with the partial data.

20. The method as claimed in claim 16 further comprising receiving a merge result based on modifying the portion of the read data with the computation result.

* * * * *